US012158588B2

(12) United States Patent
Kitakami (10) Patent No.: US 12,158,588 B2
(45) Date of Patent: Dec. 3, 2024

(54) IMAGE DISPLAY DEVICE

(71) Applicant: CANON KABUSHIKI KAISHA, Tokyo (JP)

(72) Inventor: Marina Kitakami, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 154 days.

(21) Appl. No.: 17/936,302

(22) Filed: Sep. 28, 2022

(65) Prior Publication Data
US 2023/0099286 A1 Mar. 30, 2023

(30) Foreign Application Priority Data
Sep. 29, 2021 (JP) .................................. 2021-159112

(51) Int. Cl.
*H05K 7/20* (2006.01)
*G02B 27/01* (2006.01)

(52) U.S. Cl.
CPC ..... *G02B 27/0176* (2013.01); *H05K 7/20963* (2013.01); *G02B 2027/0158* (2013.01); *G02B 27/0172* (2013.01)

(58) Field of Classification Search
CPC ............ G02B 27/0176; G02B 27/0172; G02B 2027/0158; H05K 7/20963
USPC ........................................................ 361/688
See application file for complete search history.

(56) References Cited

U.S. PATENT DOCUMENTS

| | | | | |
|---|---|---|---|---|
| 5,486,841 A * | 1/1996 | Hara | ..................... | H04N 13/398 345/9 |
| 5,970,718 A * | 10/1999 | Arnold | ...................... | A61F 7/10 62/3.5 |
| 6,755,240 B2 * | 6/2004 | Werninger | .......... | H01L 23/3672 174/15.1 |
| 7,319,590 B1 * | 1/2008 | Ingram | ................. | H01L 23/367 257/713 |
| 8,087,254 B2 * | 1/2012 | Arnold | ................ | A62B 17/005 62/3.5 |
| 9,271,427 B2 * | 2/2016 | Kilroy | ................... | H01L 23/373 |
| 9,545,030 B2 * | 1/2017 | Nikkhoo | ................ | G06F 3/011 |
| 9,791,704 B2 * | 10/2017 | Nikkhoo | ................ | G06F 1/203 |
| 9,839,166 B2 * | 12/2017 | Kim | ................... | G02B 27/0006 |
| 10,261,555 B1 * | 4/2019 | Cooper | ............. | H05K 7/20209 |
| 10,267,970 B2 * | 4/2019 | Jones, Jr. | ................ | G09G 3/002 |
| 10,416,735 B2 * | 9/2019 | Ali | ......................... | G06F 1/203 |
| 10,433,467 B2 * | 10/2019 | Hurbi | ..................... | G02B 7/002 |
| 10,852,552 B2 * | 12/2020 | Kimura | ................... | G03B 21/16 |
| 11,218,824 B1 * | 1/2022 | Huo | .................... | H04R 1/1083 |
| 11,425,361 B2 * | 8/2022 | Kitakami | ............ | H04N 13/239 |
| 11,513,573 B2 * | 11/2022 | Choi | .................. | H10K 59/8794 |
| 11,622,470 B2 * | 4/2023 | Rohena | .................. | G06F 1/203 361/699 |

(Continued)

*Primary Examiner* — Anatoly Vortman
(74) *Attorney, Agent, or Firm* — Canon U.S.A., Inc., IP Division (57) ABSTRACT

An image display device includes an observation optical system configured to guide light toward the eyes of an observer, a casing supporting the observation optical system so as to be movable along a predetermined path, a first heat dissipation part and a second heat dissipation part that are provided in the casing, positioned in opposite directions along the path with respect to the observation optical system, and configured to dissipate heat generated in the casing. A heat transfer part connects the first heat dissipation part and the second heat dissipation part so as to transfer heat between them.

9 Claims, 6 Drawing Sheets

(56) References Cited

U.S. PATENT DOCUMENTS

| | | | | |
|---|---|---|---|---|
| 11,762,208 B1* | 9/2023 | Dias | ............ | G06F 1/206 |
| | | | | 345/8 |
| 2015/0234189 A1* | 8/2015 | Lyons | ............ | G02B 27/017 |
| | | | | 345/174 |
| 2016/0179148 A1* | 6/2016 | Takagi | ............ | G06F 1/163 |
| | | | | 345/8 |
| 2016/0212889 A1* | 7/2016 | Nikkhoo | ............ | H05K 7/20963 |
| 2016/0255748 A1* | 9/2016 | Kim | ............ | G02B 27/017 |
| | | | | 361/695 |
| 2017/0184863 A1* | 6/2017 | Balachandreswaran | ............ | |
| | | | | G02B 27/0176 |
| 2018/0188543 A1* | 7/2018 | Rainisto | ............ | G02B 7/28 |
| 2018/0196485 A1* | 7/2018 | Cheng | ............ | G06F 1/206 |
| 2018/0307282 A1* | 10/2018 | Allin | ............ | G02B 27/0176 |
| 2018/0376626 A1* | 12/2018 | Hurbi | ............ | G02B 7/002 |
| 2019/0104650 A1* | 4/2019 | McGinty | ............ | H05K 7/20963 |
| 2019/0107870 A1* | 4/2019 | Ali | ............ | G06F 1/203 |
| 2020/0033921 A1* | 1/2020 | Rohena | ............ | H05K 7/20172 |
| 2021/0243428 A1* | 8/2021 | Kitakami | ............ | H04N 13/239 |

\* cited by examiner

IMAGE DISPLAY DEVICE

BACKGROUND

Field of the Disclosure

The present disclosure relates to an image display device.

Description of the Related Art

Recently the use of head-mounted displays (HMDs), worn on the head of an observer to display a video image before the observer's eyes, have increased. The HMD is used as a device that provides an experience of virtual reality (VR) and mixed reality (MR) because the HMD allows the user to readily watch a video image on a large screen and realizes easy stereoscopic viewing.

The HMD for implementing MR includes an imaging unit that captures an image of a subject corresponding to the right and left eyes of the observer, a display unit that provides a superimposed display of the image captured by the imaging unit and a three-dimensional computer graphic (3DCG) image, and an observation optical system that projects the image toward the observer. The image projected toward the observer is displayed on a display element such as a small-sized liquid crystal panel corresponding to the right and left eyes of the observer. The image is enlarged via the observation optical system corresponding to the right and left eyes of the observer, and then is guided toward the right and left eyes of the observer.

The captured image of the subject has parallax corresponding to the right and left eyes of the observer.

Then, a 3DCG image is generated as a parallax image corresponding to the right and left eyes of the observer, and is superimposed on the image captured by the imaging system so that a virtual 3DCG image can be expressed as if the subject exists in reality before the observer.

The HMD may have the function of adjusting the position of the observation optical system in accordance with the distance between the eyes of the observer. Japanese Patent Application Laid-Open No. 2021-125706 discusses a head-mounted display that includes an interpupillary adjustment mechanism for adjusting the distance between an observation optical system for the left eye and an observation optical system for the right eye, and maintains the optical accuracy even if the device body is twisted or the like by external force.

SUMMARY

According to an aspect of the present disclosure, an image display device includes an observation optical system configured to guide light toward the eyes of an observer, a casing supporting the observation optical system so as to be movable along a path which is predetermined, a first heat dissipation part and a second heat dissipation part that are provided in the casing, positioned in opposite directions along the path with respect to the observation optical system, and configured to dissipate heat generated in the casing, and a heat transfer part connecting the first heat dissipation part and the second heat dissipation part so as to transfer heat between them.

Further features of the present disclosure will become apparent from the following description of exemplary embodiments with reference to the attached drawings.

DESCRIPTION OF THE EMBODIMENTS

Hereinafter, preferred exemplary embodiments of the present disclosure will be described in detail with reference to the drawings.

In the present specification and drawings, components having substantially identical functions are given identical reference signs and redundant description thereof is omitted. The following exemplary embodiments do not limit the disclosure according to the claims. The exemplary embodiments include a plurality of features, but not all the plurality of features are necessarily essential to the disclosure. The plurality of features may be arbitrarily combined.

As the angle of view and image quality are increased, pixel count and the load of image processing increases, and the imaging unit and display element of the HMD generally tend to suffer an increase in power consumption and heat generation. As a countermeasure against heat generation, for example, a cooling unit such as a fan or a vent hole for releasing heat may be provided. However, the cooling unit such as a fan may generate noise and vibration to cause a feeling of discomfort to the observer wearing the HMD. The vent hole may take dust and the like into the device and thus is not necessarily an appropriate countermeasure for the HMD that is an optical device.

In the HMD discussed in Japanese Patent Application Laid-Open No. 2020-015293, the heat from the heat generation source arranged inside the outer casing of the device body that is not moved at the time of interpupillary adjustment is dissipated outside via the surface of the device body outer casing part. However, when the interpupillary adjustment is performed, the exposed position of the surface of the device body may change to hide the area functioning as a heat dissipation surface behind the exterior part. As a result, it is difficult to obtain sufficient heat dissipation, and an unintended temperature rise in the heat generation source may occur.

Thus, it is desired to provide an HMD with a stable heat dissipation structure regardless of the positions of the observation optical systems determined by interpupillary adjustment.

An image display device to which the present disclosure is applied is an image display device including an observation optical system that guides light toward the eyes of an observer, which is suitable for use in a head-mounted display (HMD) or handheld display (HHD). In the present exemplary embodiment, an image display device 100 is used in an HMD. In the present disclosure, the direction in which the observer with the HMD on the head faces is defined as forward direction, and the vertical and horizontal directions as viewed from the observer are defined as vertical and horizontal directions. In the present disclosure, for the sake of convenience, the horizontal axis is also called x axis, the vertical axis is also called y direction, and the front-back axis is also called z axis.

Figure 1:
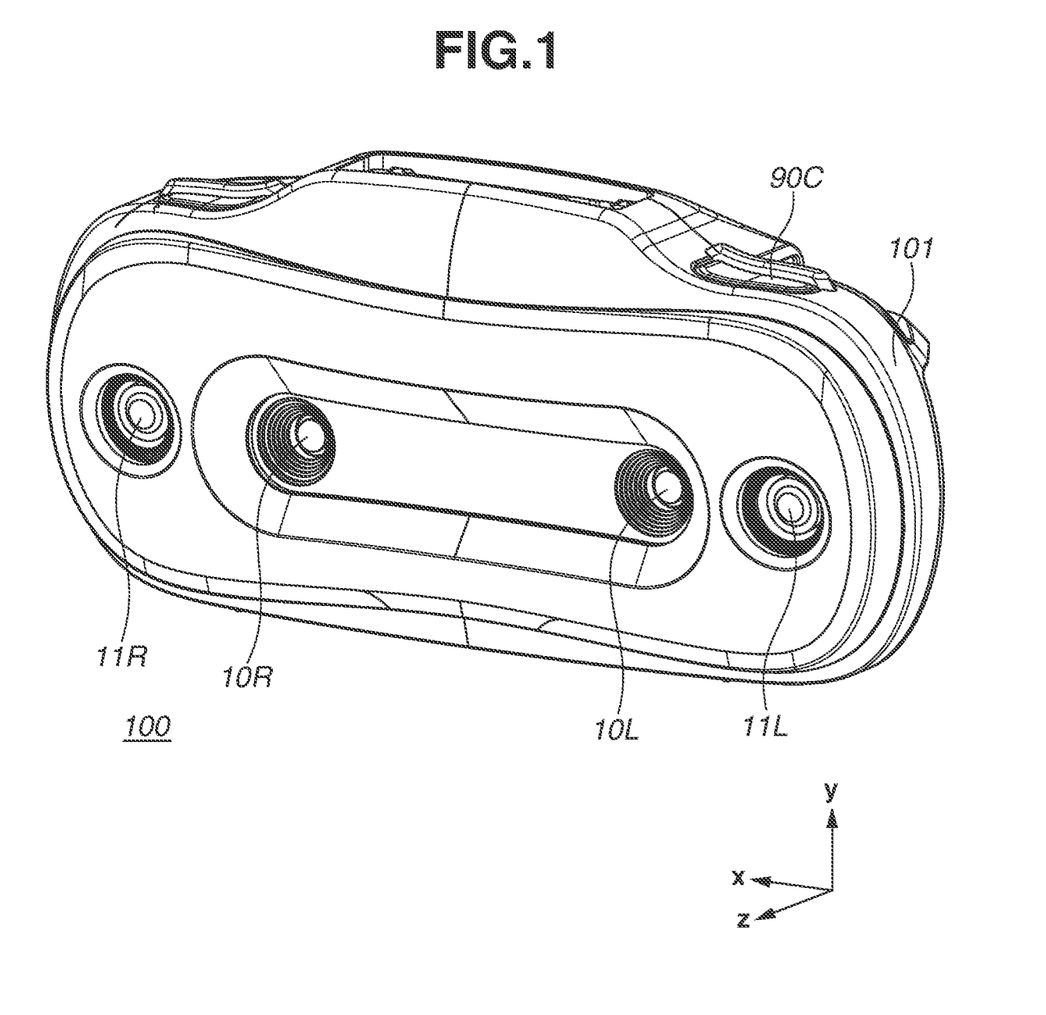
FIG. 1 is a front perspective view of an image display device.
Figure 2:
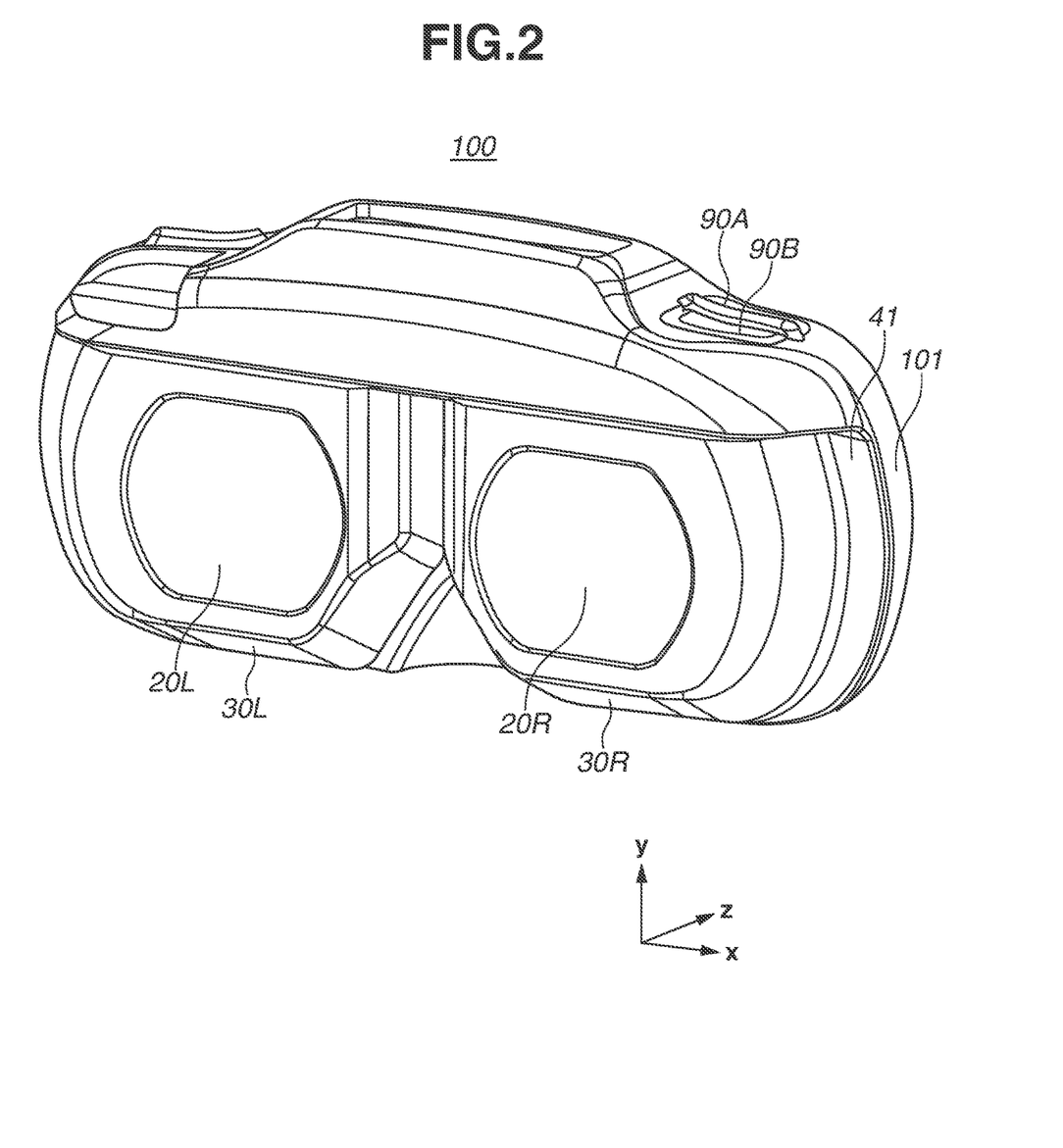
FIG. 2 is a rear perspective view of the image display device.

FIG. 1 is a perspective view of the image display device 100 as seen from the front side (opposite to the observer side). FIG. 2 is a perspective view of the image display device 100 from the rear side (the observer side).

The image display device 100 includes a horizontally long casing 101 that constitutes the outer casing and is thin in the front-back direction.

As illustrated in FIG. 1, left and right imaging cameras 10L and 10R and left and right alignment cameras 11L and 11R are provided on the front side of the casing 101. The imaging cameras 10L and 10R are stereo cameras that acquire real images to be displayed to the observer via lenses 20L and 20R.

The alignment cameras 11L and 11R are stereo cameras that acquire the position and orientation of the image display device 100 using feature points such as markers and edges of objects from the acquired images.

The alignment cameras 11L and 11R are monochrome cameras but are capable of high-accuracy, highly fault-tolerant alignment because of a wide angle of view, high shutter speed, long baseline length, and the like.

In the present exemplary embodiment, the imaging cameras 10L, 10R and the alignment cameras 11L, 11R are provided separately. Alternatively, display images and alignment information may be acquired by the imaging cameras 10L and 10R alone. In addition, the alignment cameras 11L and 11R may be replaced with distance sensors or the like using ultrasonic waves or infrared rays.

The image display device 100 transmits and receives position information and image data to and from an external personal computer or controller via a cable (not illustrated), and generates a display image in which a three-dimensional computer graphic (3DCG) image is superimposed on a real image. Then, the image display device 100 displays the generated display image on a display unit such as a liquid crystal display (LCD) or organic light emitting diode (OLED). The observer can observe the image on the display unit via the observation optical system (for example, via the lenses 20L and 20R described below).

As illustrated in FIG. 2, the left and right lenses 20L and 20R constituting the observation optical system are provided on the rear side of the casing 101. The lenses 20L and 20R are prisms, lenses, or the like that enlarge and guide the image displayed on the display unit such as an LCD or OLED included in the casing 101. The observer looks through the lenses 20L and 20R to observe the image on the display unit. Lens hoods 30L and 30R are provided around the lenses 20L and 20R. The lens hoods 30L and 30R are an example of a display exterior component.

Operation buttons 90A to 90C that accept an instructive operation or a power operation from the observer are provided on an upper side of the casing 101. The operation buttons 90A to 90C are arranged such that the observer can operate the operation buttons 90A to 90C while grasping the upper and lower parts of the casing 101. If the operation buttons are arranged in this manner, for example, it can be assumed that the user presses the operation buttons 90A to 90C by the index finger or middle finger while supporting the lower side of the image display device 100 opposed to the operation buttons 90A to 90C by the thumb. Thus, the distance between the operation buttons 90A to 90C and the opposing lower side of the image display device 100 is desirably within a distance at which the user (observer) can grasp the image display device 100 by one hand. From this background, the internal components (for example, an electric substrate described below and the like) that may increase the height of the image display device 100 are desirably arranged in the center area inside the operation buttons 90A to 90C.

Figure 3A:
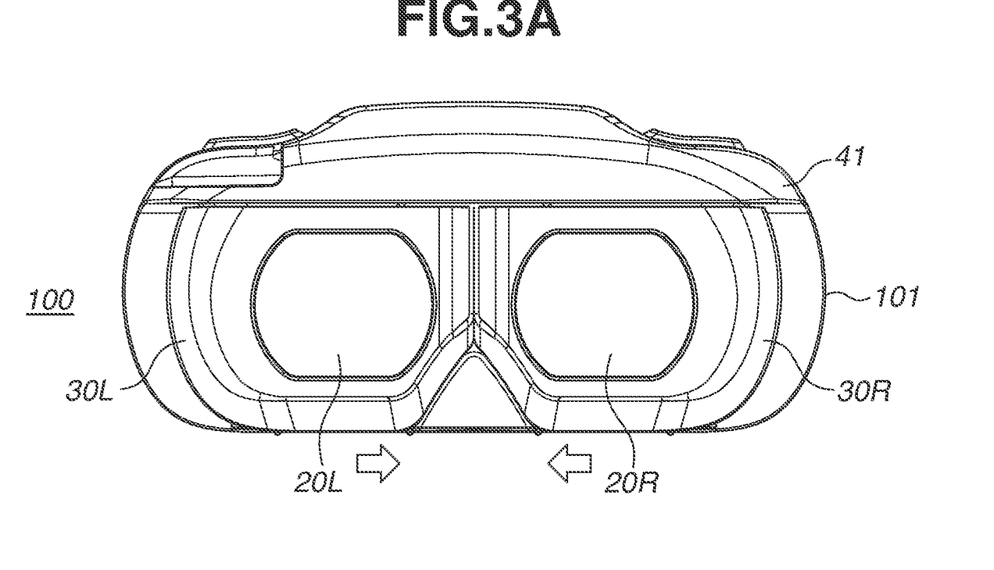
FIG. 3A is a diagram illustrating the image display device with a narrow spacing between lenses.
Figure 3B:
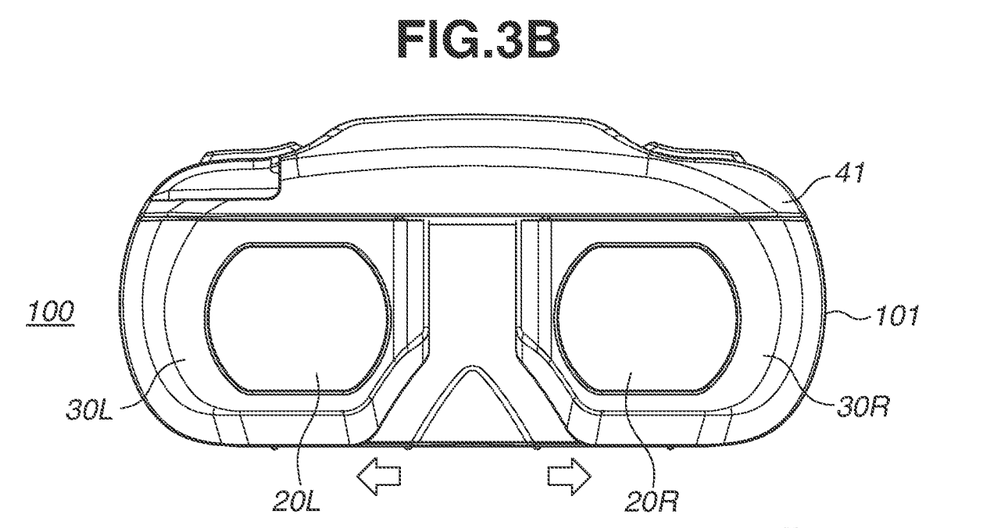
FIG. 3B is a diagram illustrating the image display device with a wide spacing between the lenses.

FIGS. 3A and 3B are rear views of the image display device 100, illustrating an example of a configuration for adjusting the spacing between the lens 20L and the lens 20R in accordance with the observer's interpupillary distance. The lenses 20L, 20R and the lens hoods 30L, 30R are engaged with each other so as to be movable in cooperation. As illustrated in FIGS. 3A and 3B, the observer can manipulate the lens hoods 30L and 30R to horizontally adjust the lenses 20L and 20R in accordance with his/her interpupillary distance.

In the present exemplary embodiment, the lens hoods 30L and 30R and a rear cover 41 described below are separately provided as an example. However, the image display device 100 according to the present exemplary embodiment is not necessarily limited to this configuration. For example, in order to reduce the number of parts, the rear cover 41 may be integrated with each of the lens hoods 30L and 30R so as to expose the lenses 20L and 20R and allow adjustment of the spacing between the lens hood 30L and the lens hood 30R. In this configuration, since the moving range of the lenses 20L and 20R in the direction of the interpupillary distance (horizontal direction) is covered with the rear cover 41, the entire image display device 100 tends to increase in size. In contrast, as in the present exemplary embodiment, by separately providing the lens hoods 30L and 30R and the rear cover 41 and moving the lenses 20L, 20R and the lens hoods 30L, 30R in cooperation, downsizing of the entire image display device 100 can be achieved.

Figure 4:
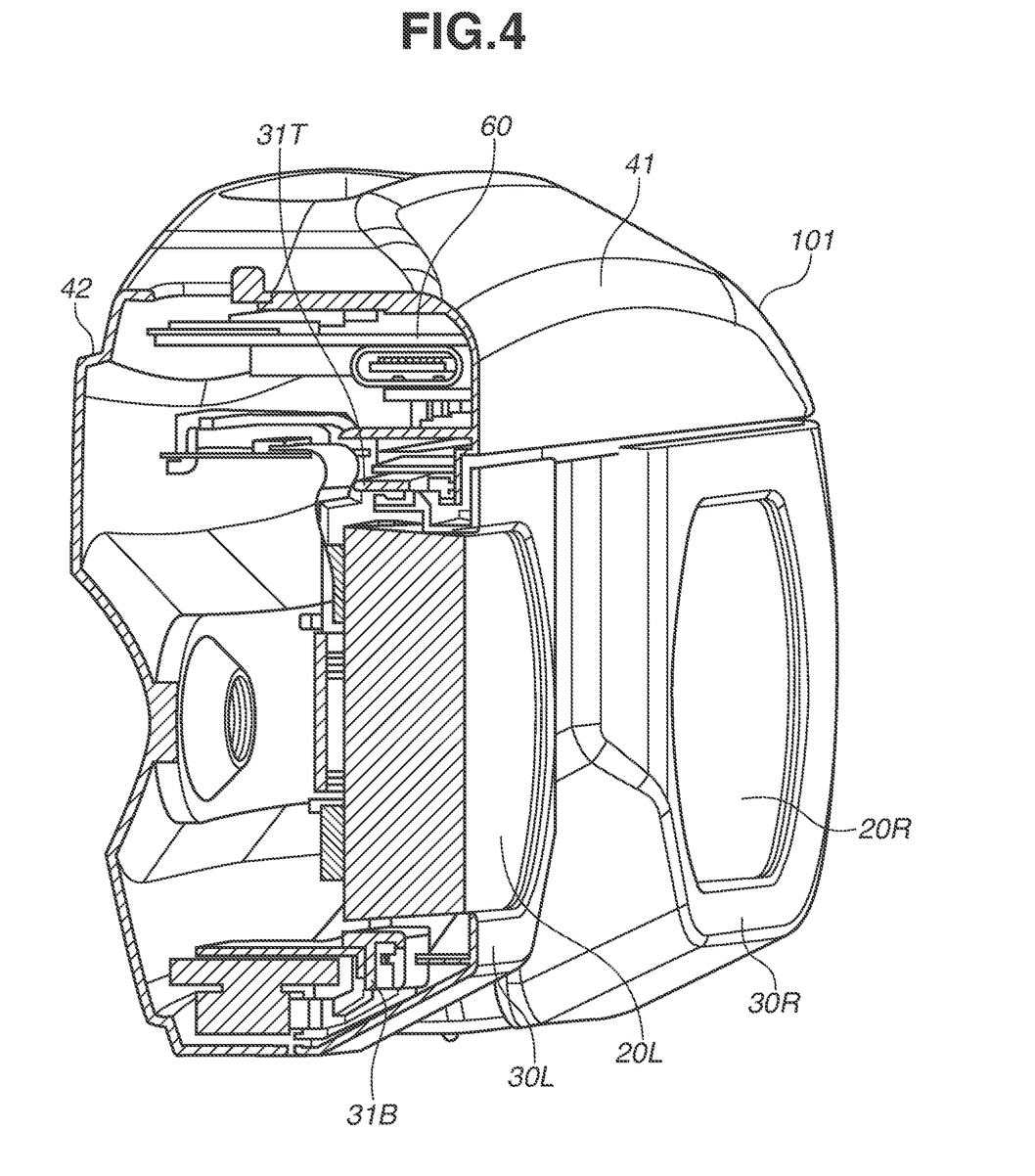
FIG. 4 is a partial cross-sectional view of the image display device.

Then, an example of an internal configuration of the image display device 100 will be described with reference to FIG. 4. FIG. 4 is a partial cross-sectional view of the image display device 100 taken along a plane substantially perpendicular to the x axis.

The rear cover 41 and a front cover 42 are engaged and integrated with each other to constitute the casing 101 in which a substrate 60 is stored. However, the rear cover 41 and the front cover 42 do not cover the lenses 20L and 20R. The lenses 20L and 20R engaged with the lens hoods 30L and 30R are supported at positions behind a portion of the rear cover 41. The rear cover 41 has rail members 31T and 31B on the upper and lower parts of a space in which the lens hoods 30L and 30R are arranged. The rail members 31T and 31B are examples of guide members. The rail members 31T and 31B are extended along the horizontal direction (the x axis), and guide the lens hoods 30L and 30R so as to be movable with respect to the rear cover 41 along a substantially linear path extending in the horizontal direction. Accordingly, the lenses 20L and 20R engaged with the lens hoods 30L and 30R are supported so as to be movable with respect to the rear cover 41 (in other words, the casing 101) in the horizontal direction (in other words, movable along the path extending in the x-axis direction).

As in the present exemplary embodiment, by separately providing the rail members 31T, 31B and the lens hoods 30L, 30R, it is possible to apply different materials to these components. For example, the image display device 100 can be made lightweight by applying a polyacetal resin (POM), which is highly slidable and is heavy in specific weight, to the rail members 31T and 31B, and applying a modified polyphenylene ether (modified PPE) with a light specific weight to the lens hoods 30L and 30R.

In the present exemplary embodiment, the guide members are arranged to guide the lens hoods 30L and 30R so as to be movable with respect to the rear cover 41. Alternatively, the guide members may be arranged to guide the lenses 20L and 20R so as to be movable with respect to the rear cover 41. As another example, the guide members may be arranged to guide the lens hoods 30L and 30R and the lenses 20L and 20R so as to be movable with respect to the rear cover 41.

Figure 5:
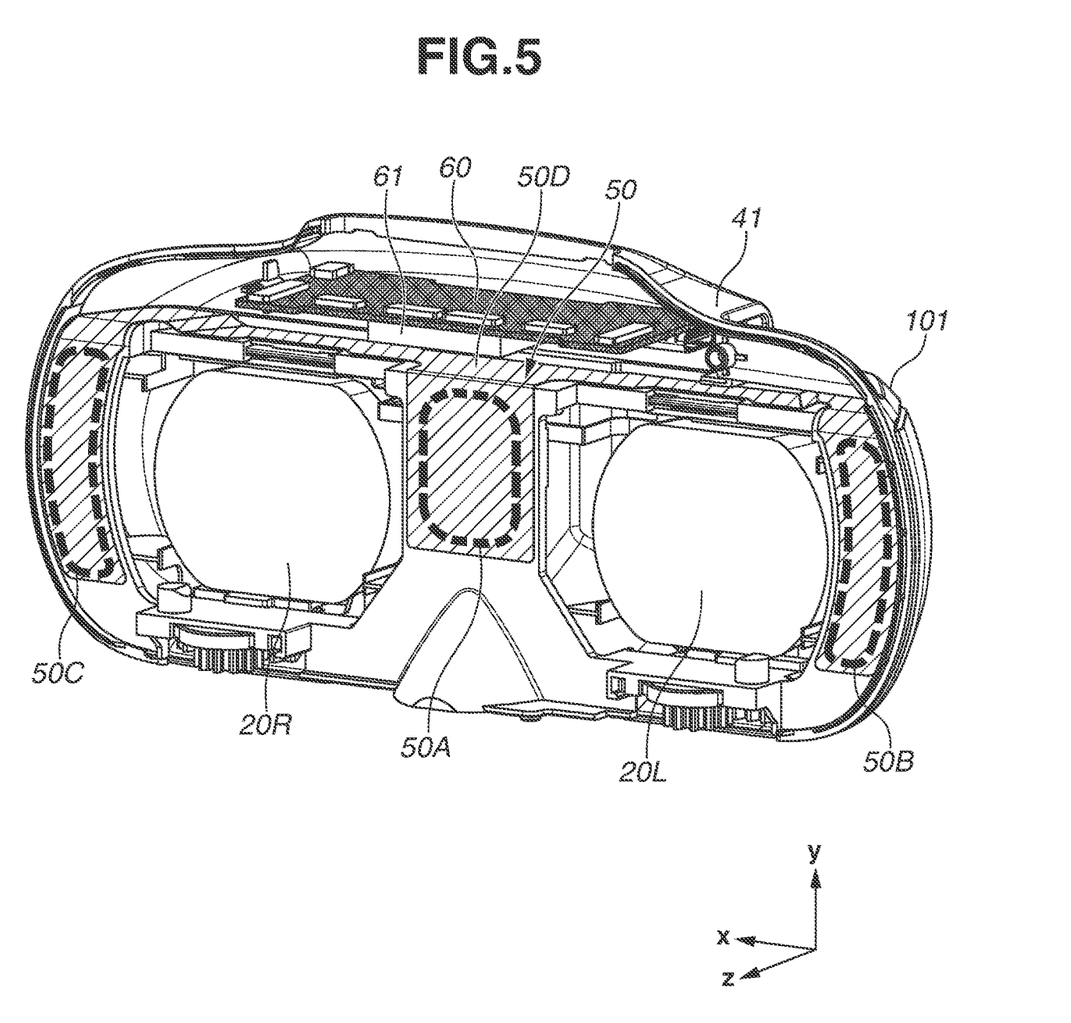
FIG. 5 is a diagram illustrating a configuration related to heat dissipation of the image display device.
Figure 6A:
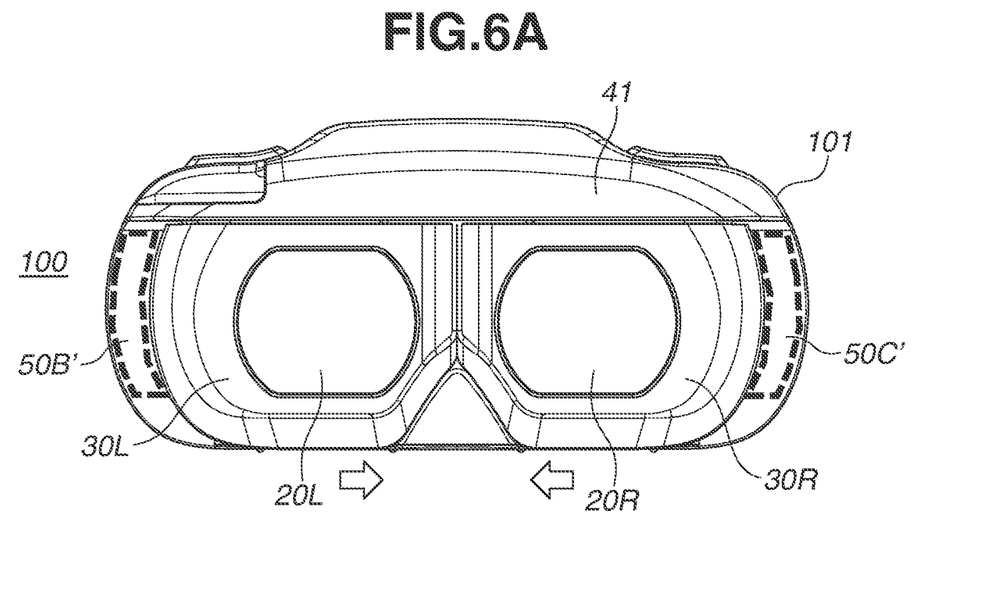
FIG. 6A is a diagram illustrating the positions of heat dissipation members in the image display device with a narrow spacing between the lenses.
Figure 6B:
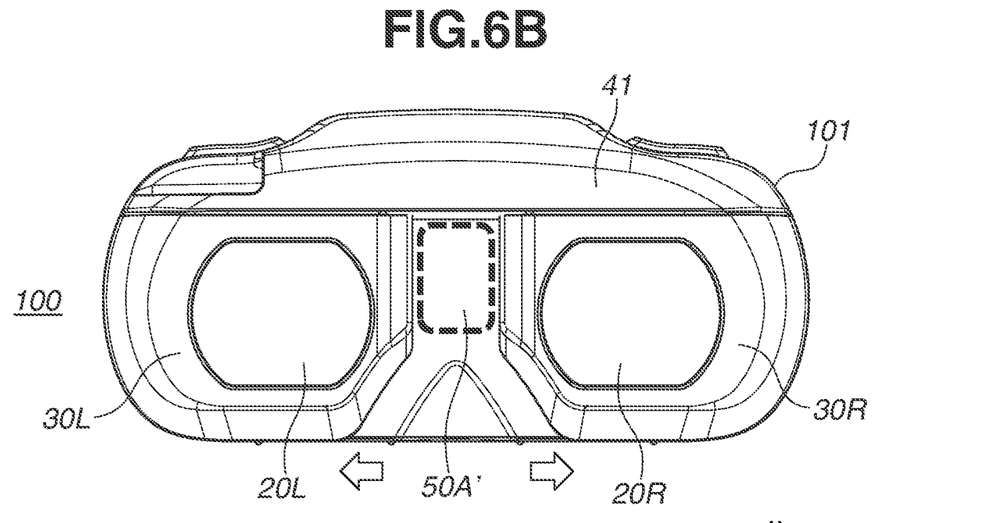
FIG. 6B is a diagram illustrating the positions of a heat dissipation member in the image display device with a wide spacing between the lenses.

Next, one example of a heat dissipation structure for dissipating heat generated in the casing 101 of the image display device 100 to the outside will be described. FIG. 5 is an internal view of the image display device 100 as seen from the front. In FIG. 5, for describing the internal configuration of the image display device 100, the front cover 42, the imaging cameras 10L and 10R, and the alignment cameras 11L and 11R are not illustrated. FIGS. 6A and 6B are diagrams illustrating the positions of heat dissipation planes from behind the image display device 100.

Elements such as a field-programmable gate array (FPGA) 61 are implemented on the substrate 60. These elements are examples of a heat generation source. Due to the arrangement of the buttons 90A to 90C described above with reference to FIGS. 1 and 2, the substrate 60 is disposed near the center of the image display device 100 as seen in the horizontal direction (the x-axis direction). In order to downsize the image display device 100 in the depth direction, the substrate 60 is arranged on the upper side of the image display device 100. The heat generated by the FPGA 61 is transmitted to the rear cover 41 by radiation or transmission via the interposed components. Then, the heat is dissipated to the outside via a surface 50A' of a portion of the rear cover 41 positioned behind a heat dissipation part 50A of a graphite sheet 50 described below.

The surface 50A' of a portion of the rear cover 41 is arranged between the lens 20L and the lens 20R. Surfaces 50B' and 50C' of other portions of the rear cover 41 are positioned outside the movable directions of the lenses 20L and 20R (in other words, the movable directions of the lens hoods 30L and 30R). That is, the surface 50B' and the surface 50A' are positioned in opposite directions with respect to the lens 20L along the path in which the lens 20L moves. Similarly, the surface 50C' and the surface 50A' are positioned in opposite directions with respect to the lens 20R along the path in which the lens 20R moves.

According to this configuration, if the lens 20L and the lens 20R are adjusted in position so as to reduce the spacing therebetween, the surface 50A' is covered with the lens hoods 30L and 30R. In this case, the surfaces 50B' and 50C' are not covered with the lens hoods 30L and 30R but are exposed to the outside.

In contrast to this, if the lens 20L and the lens 20R are adjusted in position so as to increase the spacing therebetween, the surface 50A' is not covered with the lens hoods 30L and 30R but is exposed to the outside. In this case, the surfaces 50B' and 50C' are covered with the lens hoods 30L and 30R.

The graphite sheet 50 extends in the horizontal direction (the x axis) along the rear cover 41, and includes heat dissipation parts 50A, 50B, and 50C and a heat transfer part 50D that connects the heat dissipation part 50A and the heat dissipation parts 50B and 50C so as to be capable of heat transfer. The heat dissipation parts 50A, 50B, and 50C are formed as planar members extending in the horizontal direction (the x axis) and the vertical direction (the y axis).

The heat dissipation part 50A is connected to the rear cover 41 so as to be capable of heat transfer on the back side of the surface 50A' of a portion of the rear cover 41. Similarly, the heat dissipation parts 50B and 50C are connected to the rear cover 41 so as to be capable of heat transfer on the back sides of the surfaces 50B' and 50C' of the rear cover 41 (inner side of the casing 101), respectively. As a specific example, the heat dissipation parts 50A, 50B, and 50C may be disposed such that their back side surfaces are in abutment with the back sides of the surfaces 50A', 50B' and 50C', respectively.

As illustrated in FIG. 5, the surface 50A' and the surfaces 50B', 50C' are connected to each other so as to be capable of heat transfer via the graphite sheet 50. Accordingly, if the spacing between the lenses is adjusted, there exist the heat dissipation surfaces not covered with the lens hoods 30L and 30R but exposed to the outside.

That is, if the spacing between the lens 20L and the lens 20R is adjusted so to be widened, the surface 50A' of the rear cover 41 with which the heat dissipation part 50A of the graphite sheet 50 is in abutment on the back side is exposed to the outside. In addition, if the spacing between the lens 20L and the lens 20R is adjusted so to be narrowed, the surfaces 50B' and 50C' of the rear cover 41 with which the heat dissipation part 50B and 50C of the graphite sheet 50 are in abutment on the back side are exposed to the outside. This realizes a heat dissipation structure that provides a stable heat dissipation effect regardless of the positions of the lenses 20L and 20R. Accordingly, it is possible to provide the observer with more comfortable video experience while suppressing a temperature raise in the entire image display device 100.

The surface 50A' and the surface 50B' of the rear cover 41 are examples of a "first dissipation part" and a "second heat dissipation part", respectively, positioned in opposite directions with respect to the lens 20L along the path in which the lens 20L moves. Similarly, the surface 50A' and the surface 50C' of the rear cover 41 are examples of the "first dissipation part" and the "second heat dissipation part", respectively, positioned in opposite directions with respect to the lens 20R along the path in which the lens 20R moves.

In addition, as illustrated as the surface 50A' in the examples of FIGS. 5, 6A, and 6B, among a first heat dissipation part and a second heat dissipation part corresponding to the lens 20L and the lens 20R, two heat dissipation parts positioned between the lens 20L and the lens 20R may be formed as one heat dissipation member. In other words, the heat dissipation part positioned between the lens 20L and the lens 20R may be provided as a common heat dissipation part between the lens 20L and the lens 20R. The surface 50B', the surface 50A' and the surface 50C' of the rear cover 41 are examples of a "first dissipation part", a "second heat dissipation part" and, a "third heat dissipation part" respectively.

In the present exemplary embodiment, in the graphite sheet 50, the heat transfer part 50D connecting the heat dissipation part 50A and the heat dissipation parts 50B and 50C is provided at a position not interfering with the movement of the lenses 20L and 20R (for example, outside the movable range of the lenses 20L and 20R). As a specific example, referring to FIG. 5, the graphite sheet 50 is provided with the part extending in the horizontal direction above the lenses 20L and 20R as the heat transfer part 50D. The heat transfer part 50D connects the heat dissipation part 50A and the heat dissipation parts 50B and 50C so as to be capable of heat transfer. In the graphite sheet 50, the heat transfer part 50D located above the lenses 20L and 20R and connecting the heat dissipation part 50A and the heat dissipation parts 50B and 50C is folded so as to be perpendicular to the heat dissipation surfaces of these heat dissipation parts. This suppresses an increase in the height of the image display device 100 (in other words, the height of the casing 101). By its nature, the heat transfer member exemplified as the graphite sheet 50 is desirably a member formed of a flexible member.

The configuration of the heat transfer member exemplified as the graphite sheet 50 in FIG. 5 is a mere example and is not intended to limit a configuration for providing the heat transfer member (for example, the position where to provide the heat transfer member). As a specific example, the heat transfer part 50D connecting the heat dissipation part 50A and the heat dissipation parts 50B and 50C so as to be capable of heat transfer may be provided so as to extend in the horizontal direction under the lenses 20L and 20R. However, the area under the lenses 20L and 20R is close to the protruding facial parts of the observer using the image display device 100 (for example, the nose, the cheek bones, and the like), and a temperature rise in the heat transfer part 50D may cause the observer a feeling of discomfort. In view of such circumferences, as in the configuration illustrated in FIG. 5, the heat transfer part 50D is more desirably provided at a position more separated from the body parts (for example, facial parts) of the observer using the image display device 100.

In the present exemplary embodiment, the graphite sheet 50 is supported by the rear cover 41 (in other words, the casing 101) by being attached to the rear cover 41 with a double-sided adhesive tape or the like.

The member usable as a heat transfer member is not limited to a graphite sheet and may be a member of another material that is flexible and high in heat conductivity such as a copper foil tape.

The heat transfer member may be formed by stacking and sticking together a plurality of sheet-like heat transfer members such as graphite sheets. This configuration can be expected to produce the effect of further increasing heat conduction.

Copper foil or graphite sheets with a gluing agent may be commercially available in the form of adhesive tape. Thus, using such a member makes it easy to create the heat transfer member described above and to attach the heat transfer member to the rear cover 41.

The graphite sheet 50 may be partially divided for the purpose of improving the ease of assembling the image display device 100. As a specific example, the heat dissipation parts 50A, 50B, and 50C and the heat transfer part 50D connecting these parts so as to be capable of heat transfer may be divided. In this case, in order to secure the effect of heat transfer between the members to be joined to each other, these members desirably include joint parts with a specific area or larger. On the other hand, providing such joint parts may cause heat resistance in the joint parts in the thickness direction. Thus, more ideally, it is more desired that the component corresponding to the graphite sheet 50 be formed as one sheet member.

According to the image display apparatus of the present exemplary embodiment, even in a situation where the position of the observation optical system is adjustable, it is possible to dissipate heat in a more suitable mode regardless of the position of the observation optical system.

The foregoing embodiments are merely illustrative examples of the present invention disclosure. That is, the embodiments of the present invention disclosure can be practiced in various ways without departing from its technical philosophy or key features. The foregoing embodiments are merely illustrative examples of the present invention disclosure. For example, the observation optical system is not limited to the configuration described with reference to FIGS. 1 to 6B, and the present disclosure is applicable to the observation optical system that is used for providing an image to the observer (user) and is supported so as to be movable along a predetermined path.

As a specific example, the number of the observation optical system(s) is not particularly limited, and may be one or three or more.

The movable directions of the lenses 20L and 20R (in other words, the lens hoods 30L and 30R) are not necessarily limited to the directions along a substantially linear path extending in the horizontal direction. As a more specific example, the lenses 20L and 20R may be supported so as to be movable along a curved path with respect to the casing 101. In this case, a heat dissipation part corresponding to the surface 50A' and heat dissipation parts corresponding to the surface 50B' and the surface 50C' are provided with respect to the lenses, so as to be positioned in opposite directions along the path in which the lenses move.

As far as parts exposed as a result of the movement of the lenses 20L and 20R (in other words, the lens hoods 30L and 30R) serves the role of the heat dissipation parts, the configuration of the heat dissipation parts is not necessarily limited to the example described with reference to FIGS. 5, 6A, and 6B.

For example, at least some portions of the parts corresponding to the heat dissipation parts 50A, 50B, and 50C of the graphite sheet 50 may be exposed to the outside of the casing 101 from the parts corresponding to the surfaces 50A', 50B', and 50C' of the rear cover 41, and may be used as the heat dissipation parts. In this case, openings may be provided in the parts of the rear cover 41 corresponding to the surfaces 50A', 50B', and 50C' to expose the back surfaces of the heat dissipation parts 50A, 50B, and 50C through the openings. In this case, the back surface of the heat dissipation part 50A corresponds to an example of the first heat dissipation part, and the back surfaces of the heat dissipation parts 50B and 50C correspond to an example of the second heat dissipation part.

In the example described with reference to FIGS. 5, 6A, and 6B, the rear cover 41 and the graphite sheet 50 are provided as separate members. However, the configuration for connecting the surface 50A' and the surfaces 50B' and 50C' so as to be capable of heat transfer is not limited. As a specific example, the rear cover 41 and a component corresponding to the graphite sheet 50 (heat transfer member) may be integrally formed.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of priority from Japanese Patent Application No. 2021-159112, filed Sep. 29, 2021, which is hereby incorporated by reference herein in its entirety.

What is claimed is:
1. An image display device, comprising:
an observation optical system configured to guide light toward eyes of an observer;
a casing supporting the observation optical system movable along a path which is predetermined;

a first heat dissipation part, a second heat dissipation part, and a third heat dissipation part that are configured to dissipate heat generated in the casing; and a heat transfer part connecting the first heat dissipation part, the second heat dissipation part, and the third heat dissipation part so as to transfer heat among them, wherein the observation optical system includes a first observation optical system configured to guide light toward a left eye of the observer and a second observation optical system configured to guide light toward a right eye of the observer, wherein the first heat dissipation part and the second heat dissipation part are provided in the casing so as to be positioned in opposite directions along the path with respect to the first observation optical system, wherein the second heat dissipation part and the third heat dissipation part are provided in the casing so as to be positioned in opposite directions along the path with respect to the second observation optical system, and wherein the second heat dissipation part is provided between the first observation optical system and the second observation optical system.

2. The image display device according to claim 1, further comprising a guide member that extends along the path and supports the observation optical system so as to be movable along the path, wherein the casing supports the observation optical system via the guide member.

3. The image display device according to claim 1, further comprising a heat generation source stored in the casing, wherein each of the first heat dissipation part and the second heat dissipation part dissipates heat at least from the heat generation source.

4. The image display device according to claim 1, wherein the first heat dissipation part is provided at a position that is exposed when the first observation optical system is moved along the path and arranged so that the first observation optical system covers the second heat dissipation part, and the second heat dissipation part is provided at a position that is exposed when the first observation optical system is moved along the path and arranged so that the first observation optical system covers the first heat dissipation part.

5. The image display device according to claim 1, wherein the heat transfer part is supported so as to extend along the path where the observation optical system is movable.

6. The image display device according to claim 5, wherein, when the image display device is worn on a head of the observer, the heat transfer part is supported in the casing in such a manner that the heat transfer part is separated from a position where the image display device is in contact with the head.

7. The image display device according to claim 5, wherein, when the image display device is worn on a head of the observer, the heat transfer part is supported in the casing so as to be positioned above the observation optical system.

8. The image display device according to claim 1, wherein the heat transfer part is formed of a flexible material.

9. The image display device according to claim 8, wherein the heat transfer part is formed of a graphite sheet.

* * * * *